US012717241B2

(12) United States Patent
Fu et al.

(10) Patent No.: US 12,717,241 B2
(45) Date of Patent: Aug. 25, 2026

(54) IMMERSION FLUID RECOVERY SYSTEM AND IMMERSION FLUID RECOVERY METHOD USING SAID SYSTEM

(71) Applicant: ZHEJIANG CHEER TECHNOLOGY CO., LTD., Hangzhou (CN)

(72) Inventors: Xin Fu, Hangzhou (CN); Youyang Chi, Hangzhou (CN); Min Wu, Hangzhou (CN); Yuan Li, Hangzhou (CN); Jinjie Tong, Hangzhou (CN); Liang Du, Hangzhou (CN); Ning Xu, Hangzhou (CN); Wenyu Chen, Hangzhou (CN)

(73) Assignee: ZHEJIANG CHEER TECHNOLOGY CO., LTD., Hangzhou (CN)

( * ) Notice: Subject to any disclaimer, the term of this patent is extended or adjusted under 35 U.S.C. 154(b) by 673 days.

(21) Appl. No.: 18/034,700

(22) PCT Filed: Nov. 5, 2020

(86) PCT No.: PCT/CN2020/126651
§ 371 (c)(1),
(2) Date: Apr. 29, 2023

(87) PCT Pub. No.: WO2022/088218
PCT Pub. Date: May 5, 2022

(65) Prior Publication Data
US 2023/0400774 A1 Dec. 14, 2023

(30) Foreign Application Priority Data
Oct. 29, 2020 (CN) ......................... 202011176354.3

(51) Int. Cl.
*G03F 7/00* (2006.01)

(52) U.S. Cl.
CPC ...... *G03F 7/70341* (2013.01); *G03F 7/70991* (2013.01)

(58) Field of Classification Search
CPC ...... G03F 7/70341; G03F 1/38; G03F 7/2041; G03F 7/70991; G03F 7/2043;
(Continued)

(56) References Cited

U.S. PATENT DOCUMENTS

2007/0242241 A1* 10/2007 Nagasaka ........... G03F 7/70891 355/30
2010/0149501 A1* 6/2010 Kemper .................. G03F 7/709 210/205
2014/0227644 A1* 8/2014 Kishiume ................. G03F 7/11 428/457

FOREIGN PATENT DOCUMENTS

JP 2005191344 A * 7/2005 ......... G03F 7/70341

OTHER PUBLICATIONS

English translation of JP2005-191344, published Jul. 14, 2005. (Year: 2005).*

* cited by examiner

*Primary Examiner* — Christina A Riddle
(74) *Attorney, Agent, or Firm* — Jiwen Chen; Joywin IP Law PLLC

(57) ABSTRACT

An immersion fluid recovery system and method. The system includes a recovery cavity, a sealing extraction opening, a recovery flow path, a gas-liquid separator, and an orifice plate; the sealing extraction opening and recovery cavity are at a terminal objective lens and in an immersion fluid supply and recovery apparatus above a substrate; the sealing extraction opening is in the apparatus and oriented toward the substrate, the sealing extraction opening extracts immersion fluid from a gap between the apparatus and substrate, and extracts a gas at the radial outer side of the
(Continued)

immersion fluid; the recovery cavity is inside the apparatus and communicates with the sealing extraction opening; the recovery cavity communicates with the gas-liquid separator; the orifice plate is in the recovery flow path and has through holes. The size of the through holes is less than that of a recovery pipe of the recovery flow path.

8 Claims, 4 Drawing Sheets

(58) Field of Classification Search
CPC ............. G03F 7/70325; G03F 7/70258; G03F 7/70308; G03F 7/70358; G03F 7/70691; G03F 7/70716; G03F 7/708; G03F 7/70808; G03F 7/70833; G03F 7/7085; G03F 7/70858; G03F 7/70883; G03F 7/70866; G03F 7/70875; G03F 7/70891; G03F 7/709; G03F 7/70908; G03F 7/70916; G03F 7/70925; G03F 7/70933; G03F 7/70941; G03F 7/7095; G03F 7/70958; G03F 7/70975
USPC ............................. 355/18, 30, 52–55, 66–77
See application file for complete search history.

IMMERSION FLUID RECOVERY SYSTEM AND IMMERSION FLUID RECOVERY METHOD USING SAID SYSTEM

This is a U.S. national stage application of PCT Application No. PCT/CN2020/126651 under 35 U.S.C. 371, filed Nov. 5, 2020 in Chinese, claiming priority of Chinese Application No. 202011176354.3, filed Oct. 29, 2020, all of which are hereby incorporated by reference.

TECHNICAL FIELD

The present invention relates to an immersion fluid recovery system, in particular to an immersion fluid recovery system used in an immersion lithography apparatus and an immersion fluid recovery method using said system.

BACKGROUND TECHNOLOGY

A lithography apparatus, which is one of the core equipment for manufacturing very large scale integrated circuits, may precisely project a circuit pattern on a mask onto a photoresist-coated substrate using an optical system and modify the photoresist by exposure, thereby leaving circuit pattern information on the substrate. It includes a laser light source, a projection objective lens system, a projection mask containing a circuit pattern, and a substrate coated with photosensitive photoresist.

Compared with a dry lithography apparatus with gas as an intermediate medium, an immersion lithography device fills a certain high-refractive-index fluid between the last projection objective lens and the substrate, and increases the Numerical Aperture (NA) of the projection objective lens by increasing the refractive index (n) of the gap fluid medium, thereby improving the resolution and focal depth of the lithography device. In existing mainstream lithography technologies in the relevant art, immersion lithography is widely used because of its good inheritance relative to the early dry lithography. For the filling of immersion fluid, a solution which is widely used at present is partial immersion, i.e. the fluid is confined in a partial region between the lower surface of the last projection objective lens and the upper surface of the substrate using an immersion fluid supply and recovery apparatus. Maintaining the optical consistency and transparency of the immersion fluid in an exposure area is also the key to ensure the quality of immersion lithography exposure. Therefore, in the relevant art, the immersion flow field is usually updated in real time through liquid injection and recovery, and photochemical pollutants, local heat, micro-nano bubbles and the like are timely brought away from a core exposure area, so that the high purity and uniformity of the immersion fluid are ensured.

As shown in FIG. 1 and FIG. 2, in an immersion lithography apparatus, a projection objective lens system has a terminal objective lens 1 closest to a substrate 2, and the terminal objective lens 1 and the substrate 2 form a first gap 11 therebetween; an immersion fluid supply and recovery apparatus 3 is disposed around the terminal objective lens 1, and the immersion fluid supply and recovery apparatus 3 provides immersion fluid LQ into the first gap 11, and the immersion fluid supply and recovery apparatus 3 has a central through hole 31 for passing an exposure laser beam from the terminal objective lens 1; after passing through the terminal objective lens 1, the exposure laser beam carrying circuit pattern information enters the immersion fluid LQ and is projected onto the substrate 2 after passing through the immersion fluid LQ; for the commonly used exposure laser beam with the wavelength of 193 nm in the immersion lithography apparatus, the immersion fluid LQ can be ultrapure water, and the refractive index of the ultrapure water for 193 nm laser is larger than that of air, so compared with a dry lithography apparatus, the exposure laser beam of the immersion lithography apparatus can be converged into an exposure target area with a smaller scale after passing through the terminal objective lens 1 and the immersion fluid LQ, so that a circuit pattern with a smaller scale is formed on a substrate, and the exposure resolution of the lithography apparatus is improved. In order to avoid that the immersion fluid supply and recovery apparatus 3 transmits vibration and thermal disturbance to the terminal objective lens 1 to disturb its optical properties, the immersion fluid supply and recovery apparatus 3 is disposed not to contact the terminal objective lens 1, so that a second gap 12 is formed between the terminal objective lens 1 and the immersion fluid supply and recovery apparatus 3. For the existing immersion lithography apparatus, the substrate 2 is moved relative to the terminal objective lens 1 in the exposure process according to the scan-and-step principle, so that the exposure laser beam projects a single circuit pattern into a single target area of the substrate 2 in a scanning manner, and projects the same circuit pattern into a plurality of target areas of the substrate 2 in a step-by-step manner; since the substrate 2 may move relative to the terminal objective lens 1 and the immersion fluid supply and recovery apparatus 3 is stationary relative to the terminal objective lens 1, the substrate 2 may move relative to the immersion fluid supply and recovery apparatus 3, and a third gap 13 exists between the substrate 2 and the immersion fluid supply and recovery apparatus 3.

Because the laser beam may heat the immersion fluid LQ in the exposure process, photochemical reaction of the photoresist on the substrate 2 may generate pollutants to be released into the immersion fluid LQ, the change of the temperature and cleanliness of the immersion fluid LQ will lead to the change of its optical properties, therefore, the immersion fluid supply and recovery apparatus 3 is disposed to drive the immersion fluid LQ to continuously flow and update to maintain its temperature and cleanliness, specifically, the immersion fluid supply and recovery apparatus 3 is provided with a main fluid injection opening 4 facing the second gap 12, and an immersion fluid supply system LS is used to supply the immersion fluid LQ to the second gap 12 through the main fluid injection opening 4; the immersion fluid supply and recovery apparatus 3 is provided with a main extraction opening 5 facing the second gap 12 and located on the opposite side of the main fluid injection opening 4, and an immersion fluid recovery system VC is used to extract the immersion fluid LQ through the main extraction opening 5; most of the immersion fluid LQ flows into the second gap 12 from the main fluid injection opening 4, and then flows into the first gap 11, and then the immersion fluid in the first gap 11 and the second gap 12 is extracted by the main extraction opening 5; a part of the immersion fluid LQ may flow into the third gap 13, in order to prevent a large amount of immersion fluid LQ from remaining on the surface of the substrate 2, resulting in the formation of lithography defects of the substrate 2, and to avoid damage caused by the immersion fluid LQ wetting other components, the immersion fluid supply and recovery apparatus 3 is provided with a sealing extraction opening 6 on the surface facing the substrate 2, the sealing extraction opening 6 may be a circle of evenly distributed small holes or an annular gap, and the immersion fluid recovery system VC is used to extract the immersion fluid LQ in the third gap 13 through the sealing extraction opening 6. Since the substrate 2 may pull the immersion fluid LQ during the scanning and stepping movement, in order to prevent the substrate 2 from excessively pulling the immersion fluid LQ during high-speed movement to cause the immersion fluid LQ to be out of the constraint of the sealing extraction opening 6, a gas sealing opening 7 is disposed on the radial direction outer side of the sealing extraction opening 6 in the immersion fluid supply and recovery apparatus 3, a gas supply system AS is used to supply gas flow to the third gap 13 through the gas sealing opening 7, under the action of increasing the pressure and purging of the gas flow, the constraint ability of the sealing extraction opening 6 to the immersion fluid LQ is enhanced. The main extraction opening 5 and the sealing extraction opening 6 completely extract the immersion fluid LQ, a meniscus 20 is formed between the immersion fluid LQ and the peripheral gas, and the immersion fluid space surrounded by the meniscus 20 is the immersion flow field.

In the relevant technical solution, the immersion fluid LQ and gas extracted through the sealing extraction opening 6 first enter a recovery cavity 61 in the immersion fluid supply and recovery apparatus 3, and then is extracted out of immersion fluid supply and recovery apparatus 3 along a sealing extraction flow path 62 communicating with the recovery cavity 61; in the conventional arrangement, the recovery cavity 61 is an annular cavity concentric with the central through hole 31, and a plurality of sealing extraction flow paths 62 may be disposed to communicate with the recovery cavity 61 from different directions to extract the immersion fluid LQ in time.

The extraction of the immersion fluid LQ may generate pressure pulsation inside the immersion fluid LQ, and the pressure pulsation of the immersion fluid LQ in the first gap 11 may change its optical propagation uniformity, resulting in a decrease in exposure accuracy; the pressure pulsation inside the immersion fluid LQ may further cause the vibration of the terminal objective lens 1, the substrate 2 and the immersion fluid supply and recovery apparatus 3, which will lead to the displacement or even damage of these components. The negative pressure provided by a power source of the immersion fluid recovery system VC has its own pressure pulsation, which will be transmitted to the immersion fluid LQ, and gas-liquid two-phase flow formed by extracting the immersion fluid LQ and gas at the same time in the sealing extraction flow path will generate pressure pulsation with a greater impact; gas and liquid in the gas-liquid two-phase flow have different inertia and flow velocity, and the gas flow and fluid flow disturb and impact each other, accompanied by the process of gas-liquid interface breaking and the like, which will produce pressure pulsation with complex characteristics. Therefore, it is necessary to control the extraction process of the immersion fluid LQ well to suppress the pressure pulsation generated in immersion fluid LQ.

SUMMARY OF THE INVENTION

In order to overcome the existing situation that for the existing immersion lithography apparatus, the pressure pulsation of the immersion fluid recovery system is transmitted to the immersion fluid, and gas-liquid two-phase flow may generate pressure pulsation with a greater impact, resulting in that the gas flow and the fluid flow will generate pressure pulsation with complex characteristics, even be amplified by resonance, which will lead to the displacement or even damage of the components, the present invention provides an immersion fluid recovery system and an immersion fluid recovery method using said system, which can effectively consume fluid turbulence so as to consume pressure pulsation energy, establish a stable gas-liquid channel to weaken gas-liquid impact, and adjust the transfer impedance of the flow path to the pressure pulsation wave to prevent pressure pulsation in the recovery flow path from being amplified by resonance.

In order to solve the above technical problem, the specific technical solution adopted by the present invention is as follows: an immersion fluid recovery system includes an immersion fluid supply and recovery apparatus, and is characterized by further including a sealing extraction opening, a recovery cavity, a recovery flow path, a gas-liquid separator and an orifice plate; the sealing extraction opening and the recovery cavity are disposed around a terminal objective lens and are located in the immersion fluid supply and recovery apparatus above a substrate; the sealing extraction opening is located in the immersion fluid supply and recovery apparatus and is oriented toward the substrate, the sealing extraction opening extracts immersion fluid from a gap between the immersion fluid supply and recovery apparatus and the substrate, and also extracts, from the gap, gas at the radial outer side of the immersion fluid; the recovery cavity is located inside the immersion fluid supply and recovery apparatus and is in communication with the sealing extraction opening; the recovery cavity is in communication with, by means of the recovery flow path, a cavity of the gas-liquid separator disposed outside the immersion fluid supply and recovery apparatus; the orifice plate is disposed in the recovery flow path, the orifice plate has through holes in a fluid flow direction, and the size of the diameter of the through holes is less than the size of the inner diameter of a recovery pipe of the recovery flow path where the orifice plate is located. In the immersion fluid recovery system, the orifice plate is disposed in the recovery flow path between the recovery cavity and the gas-liquid separator to suppress pressure pulsation in the recovery fluid; the disposing manner of the orifice plate can be adjusted according to actual situation, so that fluid turbulence can be obtained to consume pressure pulsation energy, and a stable gas-liquid channel can be established to weaken gas-liquid impact; and fluid turbulence can be effectively consumed so as to consume pressure pulsation energy, a stable gas-liquid channel can be established to weaken gas-liquid impact, and the transfer impedance of the flow path to the pressure pulsation wave can be adjusted to prevent pressure pulsation in the recovery flow path from being amplified by resonance.

Preferably, the ratio of the length of the orifice plate in the fluid flow direction to the diameter of the through holes is less than 2. The impact buffering and weakening effect of the through holes on the gas-liquid impact is improved, so that the pressure pulsation in the recovery flow path can be more effectively from being amplified by resonance.

Preferably, the ratio of the length of the orifice plate in the fluid flow direction to the diameter of the through holes is 2 to 20. The impact buffering and weakening effect of the through holes on the gas-liquid impact is improved, so that the pressure pulsation in the recovery flow path can be more effectively from being amplified by resonance.

Preferably, the gas-liquid separator is provided with an air pump and a liquid pump which are independent of each other, the air pump is in communication with the cavity of the gas-liquid separator and configured for extracting gas from the gas-liquid separator, and the liquid pump is in communication with the cavity of the gas-liquid separator and configured for extracting immersion fluid from the gas-liquid separator. After gas-liquid two-phase flow is subjected to gas-liquid separation, gas and liquid are extracted independently, which can improve the control accuracy of extracting power; and the extracting pump that pumps gas or liquid alone can obtain higher pressure control accuracy than the pumping pump that allows extracting the gas-liquid two-phase flow.

Preferably, the transverse distance between the axial end face of the orifice plate and the cavity of the gas-liquid separator is not more than 3 times the length of the orifice plate in the fluid flow direction. The impact buffering and weakening effect of the through holes on the gas-liquid impact is improved, so that the pressure pulsation in the recovery flow path can be more effectively from being amplified by resonance.

Preferably, the ratio of the diameter of the through holes to the inner diameter of the recovery flow path is 0.4 to 0.6. The impact buffering and weakening effect of the through holes on the gas-liquid impact is improved, so that the pressure pulsation in the recovery flow path can be more effectively from being amplified by resonance.

Preferably, the distance between the axial end face of the orifice plate and the recovery cavity is not more than 3 times the length of the orifice plate in the fluid flow direction. The impact buffering and weakening effect of the through holes on the gas-liquid impact is improved, so that the pressure pulsation in the recovery flow path can be more effectively from being amplified by resonance.

Preferably, the orifice plate is provided with a plurality of through holes. The impact buffering and weakening effect of the through holes on the gas-liquid impact is improved, so that the pressure pulsation in the recovery flow path can be more effectively from being amplified by resonance.

Preferably, an adapter is disposed in the immersion fluid supply and recovery apparatus, the adapter is disposed at the joint where the recovery flow path and the immersion fluid supply and recovery apparatus are connected, the immersion fluid supply and recovery apparatus and the recovery flow path facing the side where the gas-liquid separator is located are provided with a communicating recovery pipe, and the adapter is connected to the connection end between the immersion fluid supply and recovery apparatus and the recovery pipe; the adapter presses the orifice plate against the radial outer end face of the immersion fluid supply and recovery apparatus, and one end of the recovery pipe is fixedly connected to the adapter; and a through channel is disposed inside the adapter, and the through channel communicates with the internal space of the recovery pipe and the recovery cavity. The reliability and effectiveness of connection and recovery between the immersion fluid supply and recovery apparatus and the gas-liquid separator are improved, the reliability and effectiveness of the recovery transfer between the immersion fluid supply and recovery apparatus and the recovery pipe are improved, and a stable gas-liquid channel is more effectively established to weaken gas-liquid impact.

Preferably, the recovery cavity is provided with a plurality of recovery flow paths communicating with the gas-liquid separator. A stable gas-liquid channel is more effectively established to weaken gas-liquid impact.

Another inventive objective of the present invention is to provide an immersion fluid recovery method, which includes the following steps.

A1. A sealing extraction opening on the side, facing the substrate, of the immersion fluid supply and recovery apparatus extracts immersion fluid and gas around the periphery of the immersion fluid.

A2. The immersion fluid and gas form a gas-liquid two-phase flow, which then flows into the recovery cavity described in one of the above technical solutions.

A3. The gas-liquid two-phase flow in the recovery cavity is extracted and discharged to the gas-liquid separator described in one of the above technical solutions through the extraction flow path, wherein the gas-liquid two-phase flow passes through the orifice plate described in one of the above technical solutions in the extraction flow path, and the orifice plate has through holes which have a diameter smaller than that of the extraction flow path and through which the gas-liquid two-phase flow passes.

A4. The gas-liquid two-phase flow enters the gas-liquid separator to be separated into gas and liquid, which are then continuously extracted by the air pump and the liquid pump described in one of the above technical solutions, the air pump extracts gas from the gas-liquid separator, and the liquid pump extracts immersion fluid from the gas-liquid separator.

The suppression for the pressure pulsation in the recovery fluid is effectively realized; the disposing manner of the orifice plate can be adjusted according to actual situation, so that fluid turbulence can be utilized to consume pressure pulsation energy, or a stable gas-liquid channel can be established to weaken gas-liquid impact, and fluid turbulence can be effectively consumed so as to consume pressure pulsation energy, a stable gas-liquid channel can be established to weaken gas-liquid impact, and the transfer impedance of the flow path to the pressure pulsation wave can be adjusted to prevent pressure pulsation in the recovery flow path from being amplified by resonance. The control accuracy of the independent extraction power of gas and liquid may be improved.

The beneficial effects of the present invention are: in the immersion fluid recovery system, the orifice plate is disposed in the recovery flow path between the recovery cavity and the gas-liquid separator to suppress pressure pulsation in the recovery fluid; the disposing manner of the orifice plate can be adjusted according to actual situation, so that fluid turbulence can be utilized to consume pressure pulsation energy, or a stable gas-liquid channel can be established to weaken gas-liquid impact, or the transfer impedance of the flow path to the pressure pulsation wave can be adjusted to prevent pressure pulsation in the recovery flow path from being amplified by resonance. The fluid turbulence can be effectively consumed so as to consume pressure pulsation energy, a stable gas-liquid channel can be established to weaken gas-liquid impact, and the transfer impedance of the flow path to the pressure pulsation wave can be adjusted to prevent pressure pulsation in the recovery flow path from being amplified by resonance.

BRIEF DESCRIPTION OF THE DRAWINGS

The present invention will be further described in detail below with reference to the drawings and specific implementation modes.

DETAILED DESCRIPTION OF THE INVENTION

Embodiment 1

Figure 1:
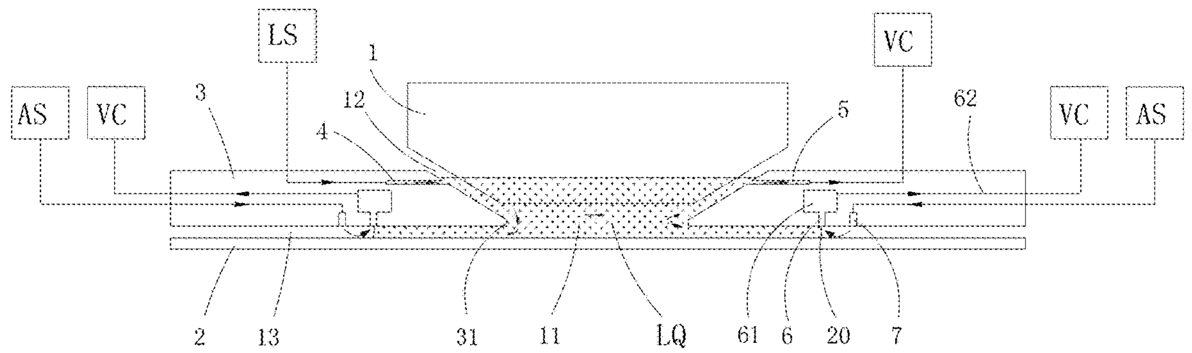
FIG. 1 is a schematic structural diagram of an immersion fluid recovery system in the relevant art.
Figure 2:
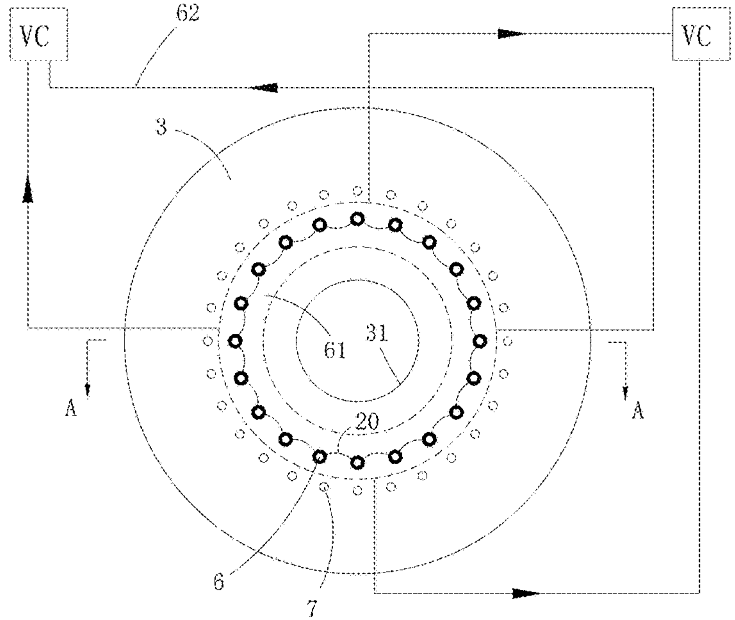
FIG. 2 is a schematic structural diagram of a bottom view of an immersion fluid recovery system in the relevant art.

In Embodiment 1 shown in FIGS. 3, 4, 5, 6, 7, 8 and 9, an immersion fluid recovery system includes an immersion fluid supply and recovery apparatus 3, and further includes a sealing extraction opening 6, a recovery cavity 61, a recovery flow path 63, a gas-liquid separator 64 and an orifice plate 67; the sealing extraction opening 6 and the recovery cavity 61 are disposed around a terminal objective lens 1 and are located in the immersion fluid supply and recovery apparatus 3 above a substrate 2; the sealing extraction opening 6 is located in the immersion fluid supply and recovery apparatus 3 and is oriented toward the substrate 2, the sealing extraction opening 6 faces the substrate 2, the sealing extraction opening 6 extracts immersion fluid from a gap between the immersion fluid supply and recovery apparatus 3 and the substrate 2, and also extracts, from the gap, a gas GS at the radial outer side of the immersion fluid; the recovery cavity 61 is located inside the immersion fluid supply and recovery apparatus 3 and is in communication with the sealing extraction opening 6; the recovery cavity 61 is in communication with, through the recovery flow path 63, a cavity of the gas-liquid separator 64 disposed outside the immersion fluid supply and recovery apparatus 3; the orifice plate 67 is disposed in the recovery flow path 63, the orifice plate 67 has through holes 671 in a fluid flow direction, and the size of the diameter of the through holes 671 is less than the size of the inner diameter of a recovery pipe of the recovery flow path 63 where the orifice plate 67 is located. The ratio of the length of the orifice plate in the fluid flow direction to the diameter of the through holes is less than 2, or the ratio of the length of the orifice plate in the fluid flow direction to the diameter of the through holes is 2 to 20. Furthermore, the ratio of the length of the orifice plate in the fluid flow direction to the diameter of the through holes is 8 to 15. The gas-liquid separator 64 is provided with an air pump and a liquid pump which are independent of each other, namely, the air pump and the liquid pump complete their corresponding extraction work independently, the air pump is in communication with the cavity of the gas-liquid separator 64 and configured for extracting gas GS from the gas-liquid separator 64, and the liquid pump 66 is in communication with the cavity of the gas-liquid separator 64 and configured for extracting immersion fluid LQ from the gas-liquid separator 64. The transverse distance between the axial end face of the orifice plate and the cavity of the gas-liquid separator is not more than 3 times the length of the orifice plate in the fluid flow direction. The ratio of the diameter of the through holes to the inner diameter of the recovery flow path is 0.4 to 0.6. The distance between the axial end face of the orifice plate and the recovery cavity is not more than 3 times the length of the orifice plate in the fluid flow direction. The orifice plate 67 is provided with a plurality of through holes 671 distributed in parallel. An adapter 32 is disposed in the immersion fluid supply and recovery apparatus, the adapter 32 is disposed at the joint where the recovery flow path and the immersion fluid supply and recovery apparatus are connected, the immersion fluid supply and recovery apparatus and the recovery flow path facing the side where the gas-liquid separator 64 is located are provided with a communicating recovery pipe 69, and the adapter 32 is connected to the connection end between the immersion fluid supply and recovery apparatus and the recovery pipe 69; the adapter presses the orifice plate against the radial outer end face of the immersion fluid supply and recovery apparatus, and one end of the recovery pipe is fixedly connected to the adapter; and a through channel is disposed inside the adapter, and the through channel communicates with the internal space of the recovery pipe and the recovery cavity 61. The recovery cavity 61 is provided with a plurality of recovery flow paths 63 communicating with the gas-liquid separator.

Embodiment 2

In the embodiment shown in FIGS. 3, 4, 5, 6, 7, 8 and 9, an immersion fluid recovery method includes the following steps.

A1. A sealing extraction opening on the side, facing a substrate, of an immersion fluid supply and recovery apparatus extracts immersion fluid and gas around the periphery of the immersion fluid.

A2. The immersion fluid and the gas form a gas-liquid two-phase flow, which then flows into the recovery cavity described in Embodiment 1.

A3. The gas-liquid two-phase flow in the recovery cavity is extracted and discharged to the gas-liquid separator described in Embodiment 1 through the extraction flow path, wherein the gas-liquid two-phase flow passes through the orifice plate described in Embodiment 1 in the extraction flow path, and the orifice plate has through holes which have a diameter smaller than that of the extraction flow path and through which the gas-liquid two-phase flow passes.

A4. The gas-liquid two-phase flow enters the gas-liquid separator to be separated into gas and liquid, which are then continuously extracted by the air pump and the liquid pump described in Embodiment 1, the air pump extracts gas GS from the gas-liquid separator 64, and the liquid pump extracts immersion fluid LQ from the gas-liquid separator 64.

A more specific implementation of the above Embodiment 1 of the present invention is described below.

Embodiment 1

Figure 3:
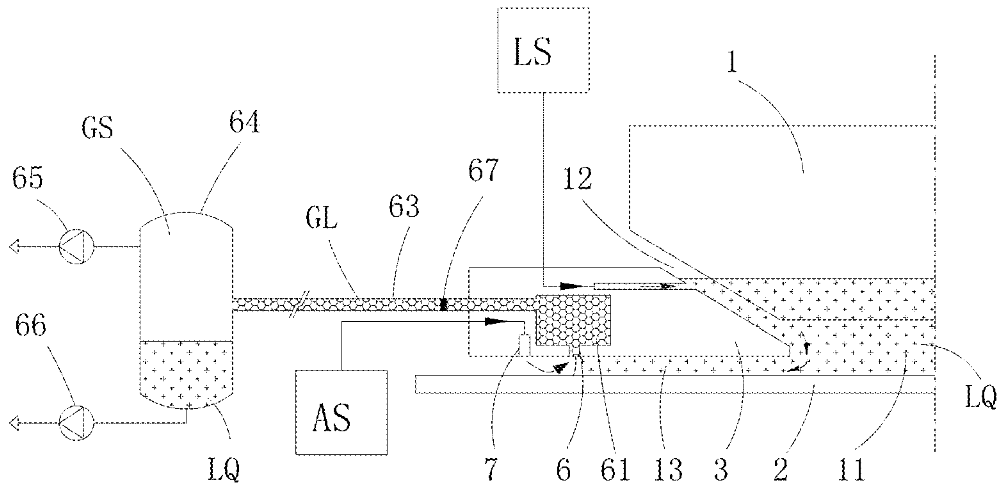
FIG. 3 is a schematic structural diagram of Embodiment I of an immersion fluid recovery system of the present invention.

As shown in FIG. 3, an immersion fluid recovery system includes a sealing extraction opening 6, a recovery cavity 61, a recovery flow path 63 and a gas-liquid separator 64; the sealing extraction opening 6 is located in the immersion fluid supply and recovery apparatus 3 and is oriented toward the substrate 2, the sealing extraction opening 6 extracts immersion fluid LQ from a third gap 13, and also extracts an environment gas from the third gap 13 at an radial direction outer side of the immersion fluid LQ or a sealing gas discharged from a gas sealing opening 7; the recovery cavity 61 is located inside the immersion fluid supply and recovery apparatus 3 and is in communication with the sealing extraction opening 6; the recovery cavity 61 is in communication with, through the recovery flow path 63, a cavity of the gas-liquid separator 64 disposed outside the immersion fluid supply and recovery apparatus 3; an air pump 65 is in communication with a cavity of the gas-liquid separator 64 and configured for extracting gas GS from the gas-liquid separator 64, and a liquid pump 66 is in communication with the cavity of the gas-liquid separator 64 and configured for extracting immersion fluid LQ from the gas-liquid separator 64; the immersion fluid LQ and gas form a gas-liquid two-phase flow GL after being extracted by the sealing extraction opening 6, and the gas-liquid two-phase flow GL flows to the gas-liquid separator 64 through the recovery cavity 61 and the recovery flow path 63, and is separated into a gas GS and an immersion fluid LQ in the gas-liquid separator 64; the pressure of the gas-liquid two-phase flow GL is unstable and difficult to control, and after the gas-liquid two-phase flow GL is separated into a gas phase and a liquid phase, the extracting power provided by the immersion fluid recovery system can be controlled to be stable by adopting a method such as monitoring the pressure of the gas phase for feedback control, so as to ensure effective extraction of the immersion liquid LQ in the third gap 13; meanwhile, the extracting pump that pumps gas or liquid alone can obtain higher pressure control accuracy than the pumping pump that allows extracting the gas-liquid two-phase flow, and therefore, after the gas-liquid two-phase flow GL is subjected to gas-liquid separation, gas and liquid are extracted independently, which can improve the control accuracy of extracting power; and the immersion fluid recovery system further includes an orifice plate 67 disposed in the recovery flow path 63 for suppressing pressure pulsation in the immersion fluid recovery system.

Figure 4:
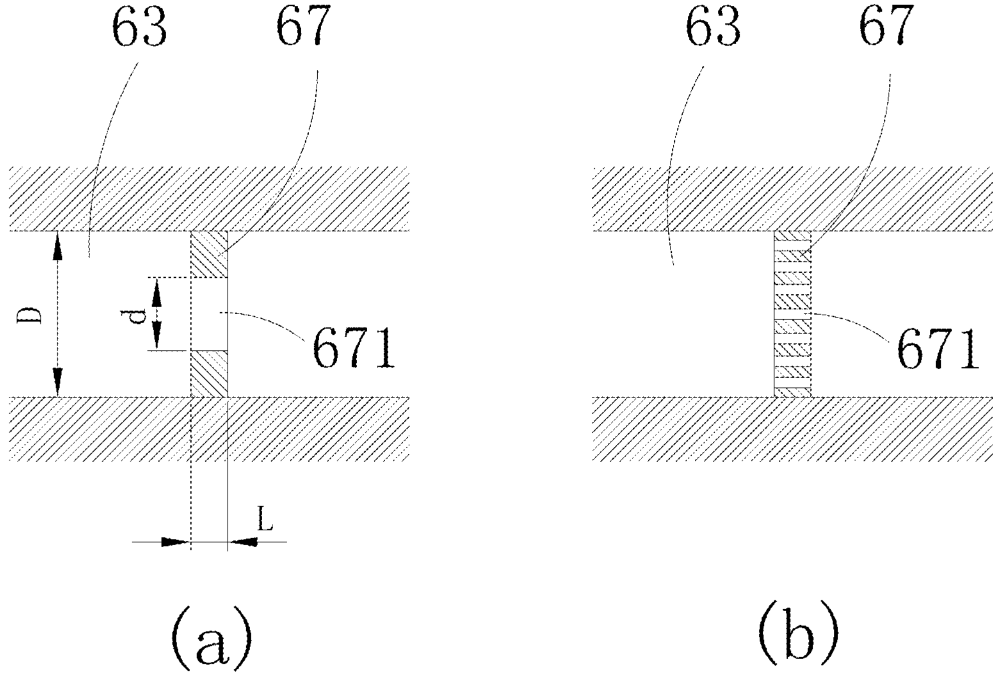
FIG. 4 is a schematic structural diagram of orifice plate in an immersion fluid recovery system of the present invention.

As shown in FIG. 4, the orifice plate 67 is disposed in the recovery flow path 63, and the orifice plate 67 has through holes 671; and the diameter d of the through holes 671 is less than the inner diameter D of the recovery flow path 63; the fluid generates disturbance flow when flowing through the orifice plate 67, and the disturbance flow may consume energy carried by pressure pulsation in the fluid, so that the effect of inhibiting the pressure pulsation is achieved; meanwhile, the pressure pulsation propagates in the medium in the form of waves, and since the diameter of the through holes 671 is different from that of the recovery flow path 63, the impedance of the fluid medium in the through holes 671 to the pressure pulsation waves is different from that of the fluid medium in the recovery flow path 63, and the pressure pulsation waves in the recovery flow path 63 are transmitted to the through holes 671, so that partial reflection in the direction of the wave source occurs, and then the pressure pulsation transmitted to the downstream is reduced; therefore, disposing the orifice plate 67 in the recovery flow path 63 can suppress pressure pulsation in the immersion liquid recovery system.

The through holes 671 may be disposed in the form of a short hole having an aspect ratio (the ratio L/d of the length L to the hole diameter d) of less than 2, or in the form of an elongated hole having an aspect ratio of 2 to 20; the through holes 671 in the form of the elongated hole allows the energy of the pressure pulsation to be dissipated more significantly within the hole due to the viscous action of the fluid, but at the same time increases the flow resistance, requiring the power source to provide more extracting power. The orifice plate 67 may be provided with one through hole 671 at the center as shown in FIG. 4 (*a*), or may be provided with a plurality of through holes 671 as shown in FIG. 4 (*b*).

Embodiment 2

Figure 5:
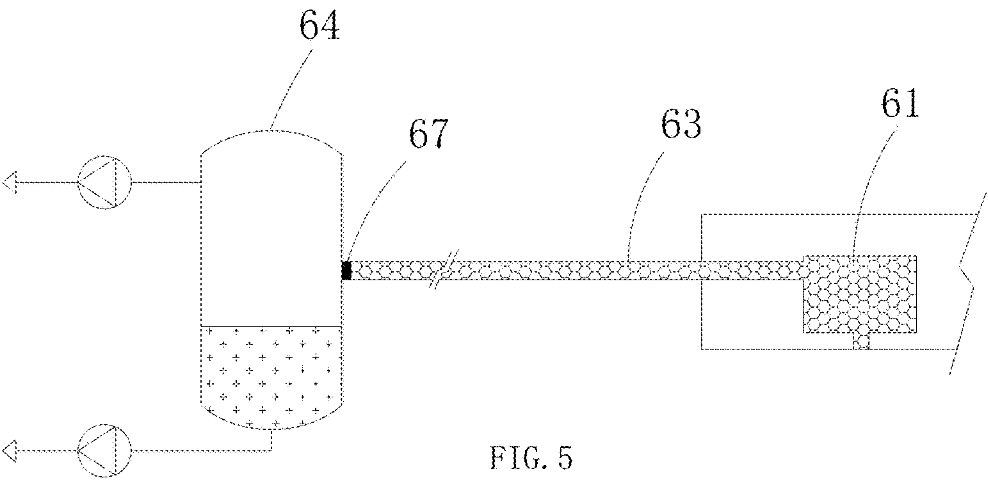
FIG. 5 is a schematic structural diagram of Embodiment II of an immersion fluid recovery system of the present invention.

As shown in FIG. 5, an orifice 67 is disposed at the joint of the recovery flow path 63 and the gas-liquid separator 64. Since the cross-sectional area of the recovery flow path 63 is different from that of the recovery cavity 61 or the gas-liquid separator 64, the transmission impedances of the fluid media in the three to the pressure pulsation waves are also different; in the recovery flow path 63, a reflection phenomenon occurs when the pressure pulsation wave from the recovery cavity 61 propagates to the joint with the recovery cavity 61 or the gas-liquid separator 64, the reflected pressure pulsation wave is superimposed on the incident pressure pulsation wave to form a standing wave phenomenon, and a resonance phenomenon may occur, so that the pressure pulsation is amplified in the recovery flow path 63, and the amplified pressure pulsation is transmitted to the recovery cavity 61 and the gas-liquid separator 64. The orifice 67 is disposed at the joint of the large-volume gas-liquid separator 64 and the recovery flow path 63 according to a transmission model of the pressure pulsation wave.

By setting the aperture ratio of the orifice plate 67 according to formula $$C=\left(1+\frac{0.707}{\sqrt{1-\left(\frac{d}{D}\right)^2}}\right)^2\left[\left(\frac{D}{d}\right)-1\right]^2u,$$

the reflection condition of pressure pulsation wave at the joint of the gas-liquid separator 64 and recovery flow path 63 may be eliminated, so that the standing wave in the recovery flow path 63 is changed into traveling wave transmitted downstream, thus preventing the pressure pulsation from being enhanced in the recovery flow path 63; in the formula, C is the sound velocity of the fluid medium in the recovery flow path 63, in the solution, since the volume flow rate of gas is often significantly greater than that of liquid, C can be the sound velocity of gas; d is the diameter of the through holes in the orifice plate 67, for the perforated orifice plate 67, d is the diameter of each through hole; D is the diameter of the recovery flow path; and u is the average flow velocity of the fluid medium in the recovery flow path 63, and in the solution, the average flow velocity of gas can be taken. Combined with experience, the average flow velocity of gas in the recovery flow path 63 is usually within the range of 20 to 30 m/s, and the size of the orifice plate 67 may better suppress the phenomenon of pressure pulsation resonance in the recovery flow path 63 by d/D=0.4 to 0.6.

Preferably, the distance between the axial end face of the orifice plate 67 and the cavity of the gas-liquid separator 64 is not more than 3 times the length L of the orifice plate 67.

Other implementation modes are the same as that of Embodiment 1.

Embodiment 3

Figure 6:
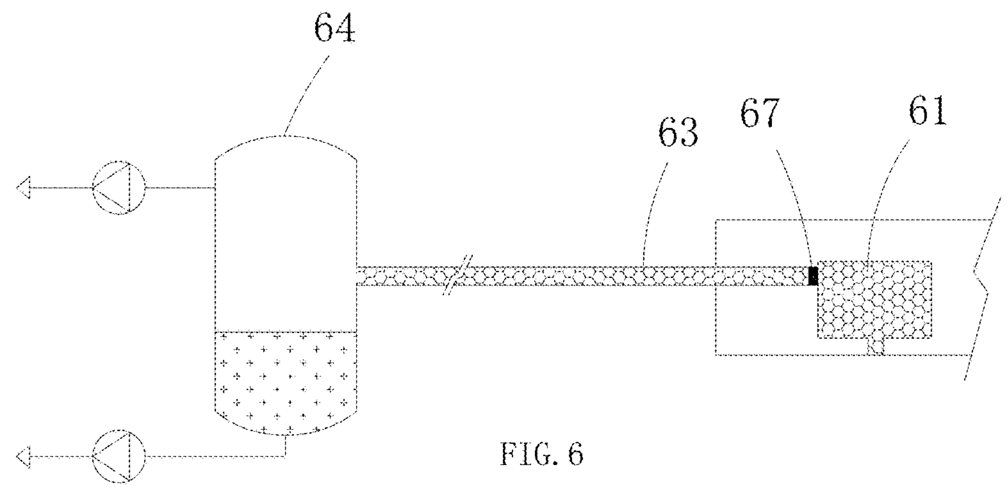
FIG. 6 is a schematic structural diagram of Embodiment III of an immersion fluid recovery system of the present invention.

As shown in FIG. 6, the orifice plate 67 is disposed at the joint of the recovery flow path 63 and the recovery cavity 61, similar to Embodiment 2, the orifice plate 67 may eliminate the pressure pulsation reflection condition at one end, close to the of the recovery cavity 61, of the recovery flow path 63, so that the pressure pulsation wave from the gas-liquid separator 64 will not form a standing wave in the recovery flow path 63, thereby suppressing the phenomenon of pressure pulsation resonance in the recovery flow path 63.

Preferably, the distance between the axial end face of the orifice plate 67 and the cavity of the gas-liquid separator 64 is not more than 3 times the length L of the orifice plate 67.

Other implementation modes are the same as that of Embodiment 1.

Embodiment 4

The orifice plate 67 is disposed at the joint of the recovery flow path 63 and recovery cavity 61, and the orifice plate 67 adopts the form of perforated plate.

Figure 7:
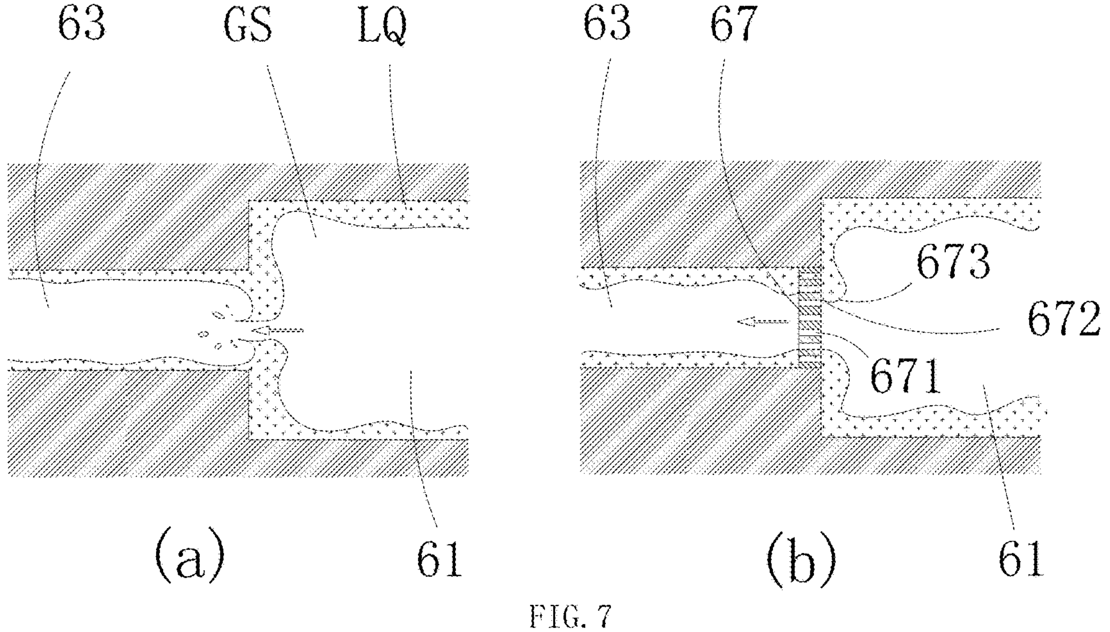
FIG. 7 is a schematic diagram of working principle of Embodiment IV of an immersion fluid recovery system of the present invention.

The beneficial effects that the orifice plate 67 is disposed at the joint of the recovery flow path 63 and the gas-liquid separator 61 are the same as that of Embodiment 3. The advantages that the orifice plate 67 is disposed in the perforated form are illustrated by reference to FIG. 7; since the cross-sectional areas of the recovery cavity 61 and the recovery flow path 63 are not equal in the flow direction, the flow velocity of immersion liquid LQ and gas GS will change when they flow from the recovery cavity 61 to the recovery flow path 63, which will cause the disturbance of the flow system in the transition area of section; as shown in FIG. 7 (*a*), the disturbance of the flow system may cause that sometimes the immersion liquid LQ completely covers the end opening of the recovery flow path 63, while the flow of gas GS to the recovery flow path 63 will break through the barrier of the immersion liquid LQ, resulting in the "splash" phenomenon of the immersion liquid LQ; gas impact on liquid, gas-liquid interface rupture and liquid splash all will aggravate pressure pulsation; as shown in FIG. 7 (*b*), the perforated orifice plate 67 is disposed between the recovery cavity 61 and the recovery flow path 63, since the sharp edge 672 near the through hole of the orifice plate 67 has a blocking effect on the gas-liquid interface 673 due to the "contact line pinning" behavior, when the gas GS occupies the through holes 671 at the radial direction inner side to establish a gas channel, the immersion liquid LQ attached to the solid wall could not easily occupy the gas channel, but tends to occupy the through holes 671 at the radial direction outer side to establish the liquid channel, therefore, the orifice plate 67 assists the gas and liquid to establish a more stable flow channel, reducing the phenomenon of gas-liquid impact on each other and suppressing the pressure pulsation in the fluid. Preferably, the distance between the axial end face of the orifice plate 67 and the cavity 61 is not more than 3 times the length L of the orifice plate 67. Other implementation modes are the same as that of Embodiment 1.

Embodiment 5

Figure 8:
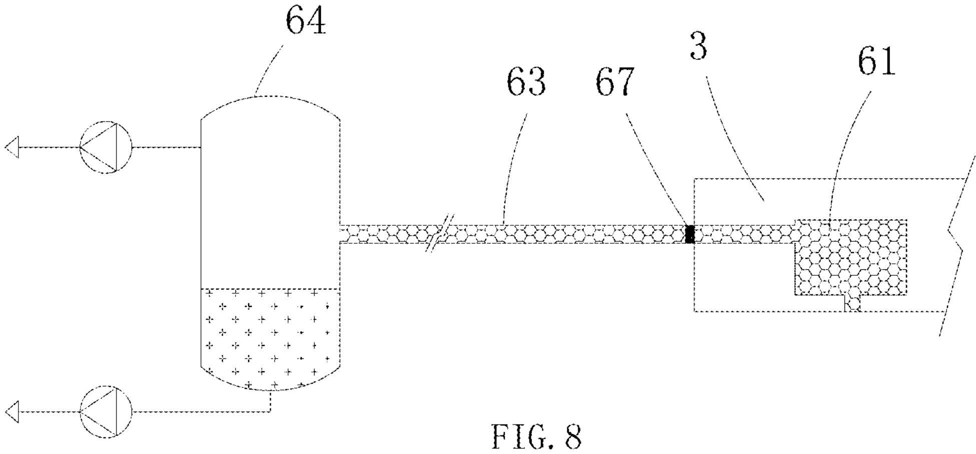
FIG. 8 is a schematic structural diagram of Embodiment V of an immersion fluid recovery system of the present invention.
Figure 9:
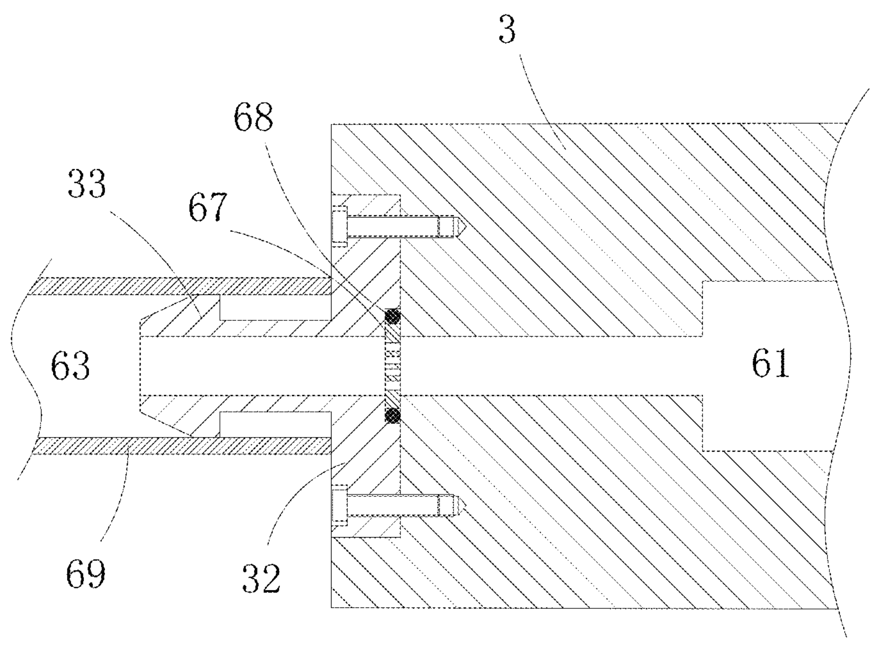
FIG. 9 is a schematic structural diagram of assembly of orifice plate of Embodiment V of an immersion fluid recovery system of the present invention.

As shown in FIGS. 8 and 9, an orifice 67 is disposed at the intersection of a recovery flow path 63 and the radial outer end face of an immersion fluid supply and recovery apparatus 3. An adapter 32 is connected to the end face of the immersion fluid supply and recovery apparatus 3 by bolts and other means, the adapter 32 has a through channel communicating with a recovery cavity 61, the adapter 32 has a pagoda head 33, a recovery pipe 69 is inserted and pressed on the pagoda head 33 to form a fixed connection, the inner space of the recovery pipe 69 and the adapter 32 is in communication and is in communication with the recovery cavity 61 to form the recovery flow path 63; the adapter 32 presses the orifice plate 67 on the end face of the immersion fluid supply and recovery device 3, and is located on the recovery flow path 63; and a seal ring 68 is disposed on the periphery of the orifice plate 67 to prevent fluid from leaking out of the recovery flow path 63 along the assembly gap. As the internal space of the immersion fluid supply and recovery apparatus 3 is usually small, the mode shown in this embodiment is a setting mode for more conveniently assembling and disassembling the orifice plate 67; moreover, since the recovery cavity 61 is usually close to the adapter 32 and the recovery pipe 69 is long, the setting position of the orifice plate 67 in this embodiment is close to the recovery cavity, which is similar to the setting way of the orifice plate 67 in Embodiment 3 or Embodiment 4, to a certain extent, beneficial effects similar to Embodiment 3 or Embodiment 4 in suppressing pressure pulsation resonance and gas-liquid mutual impact in the transition area of section can be achieved.

Other implementation modes are the same as that of Embodiment 1.

According to an example of an immersion fluid recovery system implemented in Embodiment 5, an orifice plate with a thickness of 0.5 mm is disposed in a recovery flow path with a diameter of 8 mm, and 60 through holes with a diameter of 0.3 mm are distributed in the orifice plate, typical sampling points are taken in the first gap to measure the pressure in the immersion liquid, and the peak-peak value of the pressure pulsation measured in the experiment is less than 120 Pa, after removing the orifice plate, the peak-peak value of pressure pulsation may exceed 120 Pa and reach about 200 Pa.

The present invention may be implemented in any of the implementation mode from Embodiments 1 to 5; and it can also be implemented by combining Embodiments 1 to 5 according to the pressure pulsation in the immersion fluid recovery system. For example, if the pressure pulsation generated in the recovery cavity is stronger than that generated by the recovery flow path and the gas-liquid separator in a certain example of the immersion fluid recovery system, the implementation mode of Embodiment 2 may be adopted to reduce the reflection and transmission of pressure pulsation waves to the recovery cavity, or the pressure pulsation generated by the gas-liquid impact behavior at the joint of the recovery cavity and the recovery flow path may be alleviated by adopting the mode of Embodiment 4, or Embodiments 2 and 4 can also be combined to achieve the beneficial effects of reducing the pressure pulsation reflection and gas-liquid impact behavior at the same time; if the pressure pulsation generated in the gas-liquid separator is stronger than that generated in the recovery flow path and the recovery cavity in a certain example of immersion fluid recovery system, the phenomenon of resonant amplification of the pressure pulsation wave in the recovery flow path may be suppressed by adopting the mode of Embodiments 3.

In the description of the positional relationship of the present invention, orientation or position relationships indicated by terms "inner", "outer", "upper", "lower", "left", "right" and the like are orientation or position relationships shown in the drawings, are adopted not to indicate or imply that indicated apparatus or components must be in specific orientations or structured and operated in specific orientations but only to conveniently and simply describe the present invention and thus should not be understood as limits to the present invention.

The forgoing contents and structures describe the basic principles and main features of the product of the present invention and the advantages of the present invention, which will be understood by those skilled in the art. The descriptions of the examples and the specification are only the principles of the present invention. The present invention may have various variations and modifications, which shall fall within the scope claimed for protection in the present invention, without departing from the spirit and scope of the present invention. The scope claimed for protection in the present invention is defined by the attached claims and equivalents thereof.

The invention claimed is:

1. An immersion fluid recovery system, comprising an immersion fluid supply and recovery apparatus and a recovery cavity, and characterized by further comprising a sealing extraction opening, a recovery flow path, a gas-liquid separator and an orifice plate; the sealing extraction opening and the recovery cavity are disposed around a terminal objective lens and are located in the immersion fluid supply and recovery apparatus above a substrate; the sealing extraction opening is located in the immersion fluid supply and recovery apparatus and is oriented toward the substrate, the sealing extraction opening extracts immersion fluid from a gap between the immersion fluid supply and recovery apparatus and the substrate, and also extracts, from the gap, gas at the radial outer side of the immersion fluid; the recovery cavity is located inside the immersion fluid supply and recovery apparatus and is in communication with the sealing extraction opening; the recovery cavity is in communication with, by means of the recovery flow path, a cavity of the gas-liquid separator disposed outside the immersion fluid supply and recovery apparatus; the orifice plate is disposed in the recovery flow path, the orifice plate has through holes in a fluid flow direction, and the size of a diameter of the through holes is less than the size of an inner diameter of a recovery pipe of the recovery flow path where the orifice plate is located;

wherein an adapter is disposed in the immersion fluid supply and recovery apparatus, the adapter is disposed at the joint where the recovery flow path and the immersion fluid supply and recovery apparatus are connected, the immersion fluid supply and recovery apparatus and the recovery flow path facing the side where the gas-liquid separator is located are provided with a communicating recovery pipe, and the adapter is connected to the connection end between the immersion fluid supply and recovery apparatus and the recovery pipe; the adapter presses the orifice plate against the radial outer end face of the immersion fluid supply and recovery apparatus, and one end of the recovery pipe is fixedly connected to the adapter; and a through channel is disposed inside the adapter, and the through channel communicates with the internal space of the recovery pipe and the recovery cavity.

2. The immersion fluid recovery system according to claim 1, wherein the ratio of the length of the orifice plate in the fluid flow direction to the diameter of the through holes is less than 2.

3. The immersion fluid recovery system according to claim 1, wherein the ratio of the length of the orifice plate in the fluid flow direction to the diameter of the through holes is 2 to 20.

4. The immersion fluid recovery system according to claim 1, wherein the transverse distance between the axial end face of the orifice plate and the cavity of the gas-liquid separator is not more than 3 times the length of the orifice plate in the fluid flow direction.

5. The immersion fluid recovery system according to claim 1, wherein the ratio of the diameter of the through holes to the inner diameter of the recovery flow path is 0.4 to 0.6.

6. The immersion fluid recovery system according to claim 1, wherein the distance between the axial end face of the orifice plate and the recovery cavity is not more than 3 times the length of the orifice plate in the fluid flow direction.

7. The immersion fluid recovery system according to claim 1, wherein the recovery cavity is provided with a plurality of recovery flow paths communicating with the gas-liquid separator.

8. An immersion fluid recovery method, comprising the following steps:

A1: extracting immersion fluid and gas around the periphery of the immersion fluid by means of a sealing extraction opening on the side, facing a substrate, of an immersion fluid supply and recovery apparatus;

A2: the immersion fluid and the gas forming a gas-liquid two-phase flow, which then flows into the recovery cavity described in claim 1;

A3: extracting the gas-liquid two-phase flow from the recovery cavity and discharging same to the gas-liquid separator described in claim 1 through the recovery flow path, wherein the gas-liquid two-phase flow passes through the orifice plate described in claim 1 in the recovery flow path, and the orifice plate has through holes which have a diameter smaller than that of the recovery flow path and through which the gas-liquid two-phase flow passes; and A4: the gas-liquid two-phase flow entering the gas-liquid separator to be separated into gas and liquid, which are then continuously extracted by an air pump and a liquid pump, wherein the air pump extracts gas from the gas-liquid separator, and the liquid pump extracts immersion fluid from the gas-liquid separator.

* * * * *